United States Patent
Honma

(10) Patent No.: US 11,702,747 B2
(45) Date of Patent: Jul. 18, 2023

(54) ROTATION DRIVING MECHANISM AND ROTATION DRIVING METHOD, AND SUBSTRATE PROCESSING APPARATUS AND SUBSTRATE PROCESSING METHOD USING SAME

(71) Applicant: Tokyo Electron Limited, Tokyo (JP)

(72) Inventor: Manabu Honma, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 252 days.

(21) Appl. No.: 16/953,930

(22) Filed: Nov. 20, 2020

(65) Prior Publication Data

US 2021/0164098 A1    Jun. 3, 2021

(30) Foreign Application Priority Data

Nov. 28, 2019 (JP) ................... 2019-215580

(51) Int. Cl.
*C23C 16/458* (2006.01)
*C23C 16/455* (2006.01)
*H01L 21/687* (2006.01)
*H01L 21/02* (2006.01)

(52) U.S. Cl.
CPC .... *C23C 16/4584* (2013.01); *C23C 16/45544* (2013.01); *H01L 21/0228* (2013.01); *H01L 21/02164* (2013.01); *H01L 21/68764* (2013.01)

(58) Field of Classification Search
CPC ......... H01L 21/68771; H01L 21/68674; C23C 16/45551
See application file for complete search history.

(56) References Cited

U.S. PATENT DOCUMENTS

2010/0258432 A1* 10/2010 Ernult ................... C23C 14/351
 204/192.12
2012/0321787 A1* 12/2012 Fang ................. C23C 16/45565
 118/500

FOREIGN PATENT DOCUMENTS

JP        2016-096220       5/2016

\* cited by examiner

*Primary Examiner* — Joseph A Miller, Jr.
(74) *Attorney, Agent, or Firm* — Ipusa, PLLC

(57) ABSTRACT

A rotation driving mechanism includes a turntable configured to rotate about a first axis, and a rotating plate disposed along a circumferential direction of the turntable and configured to rotate about a second axis independently of a rotation of the turntable. A driving plate is coaxially disposed with the first axis and is rotatable differently in rotational direction and rotational speed from the rotation of the turntable. A trajectory plate is fixed to the driving plate and disposed in the vicinity of the second axis of the rotating plate. The trajectory plate includes a rolling trajectory groove in a surface. The trajectory groove has a curved shape in a plan view. A horizontal rotating member is coupled to and fixed to the rotating plate and engaged with the rolling trajectory groove. The horizontal rotating member rotates the rotating plate by moving and rolling through the rolling trajectory groove.

9 Claims, 16 Drawing Sheets

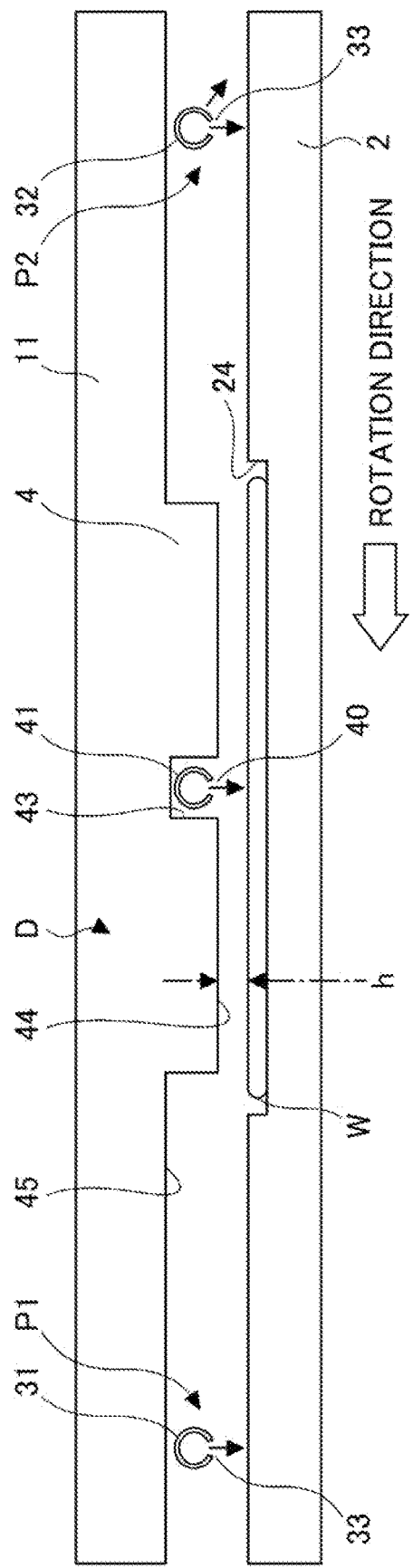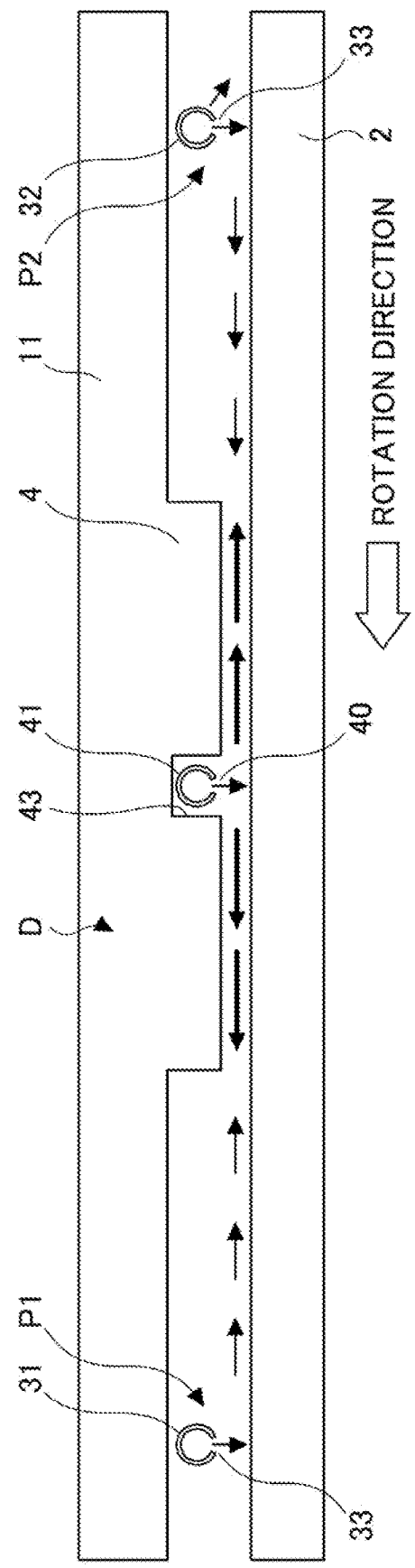

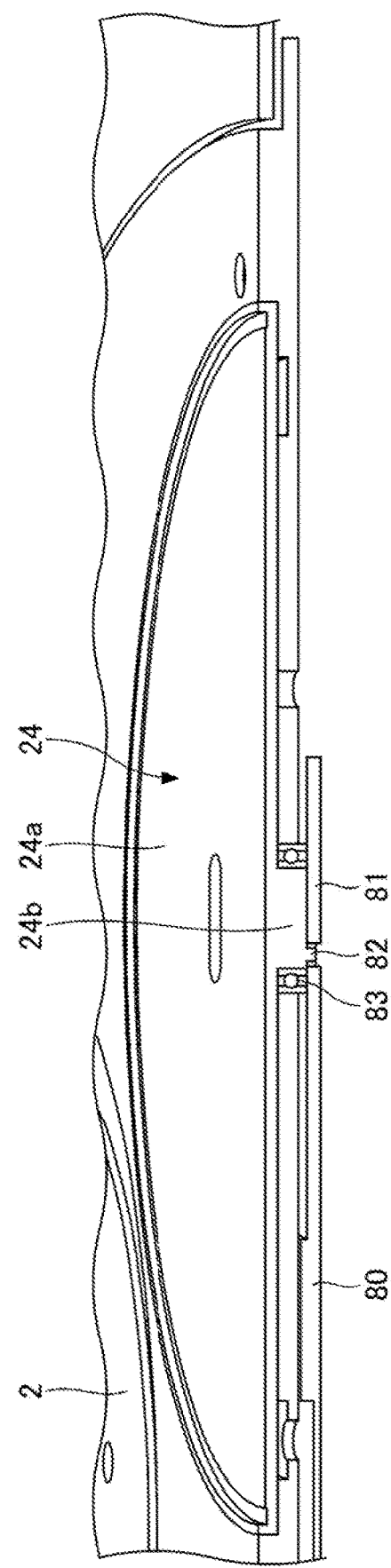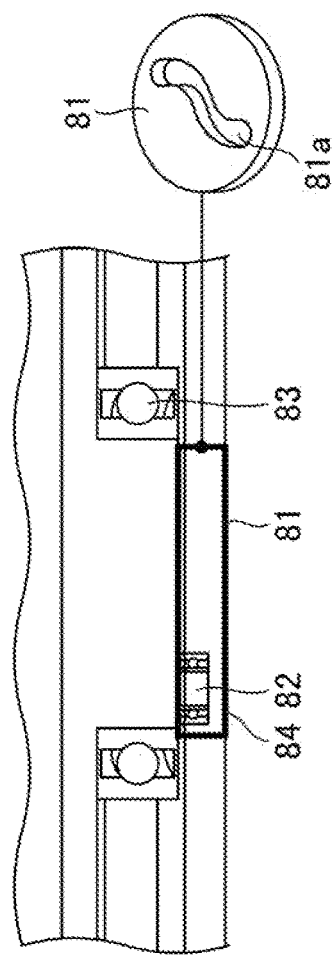

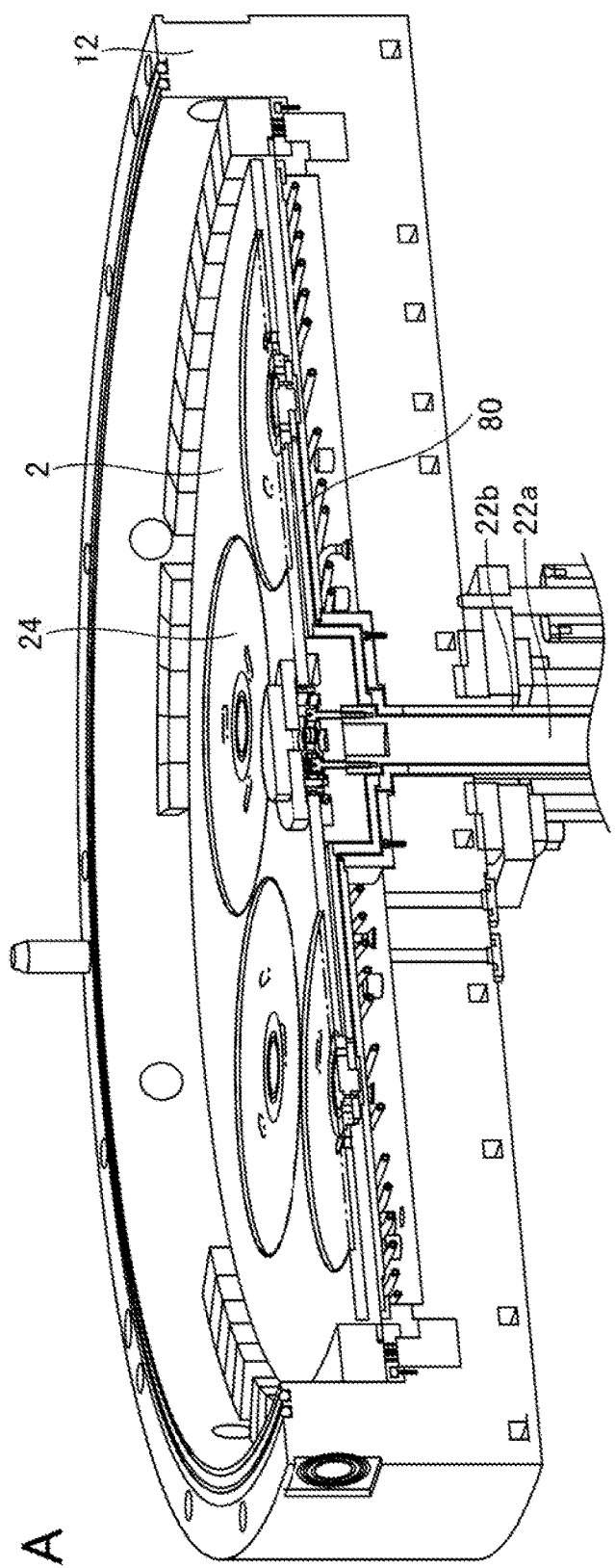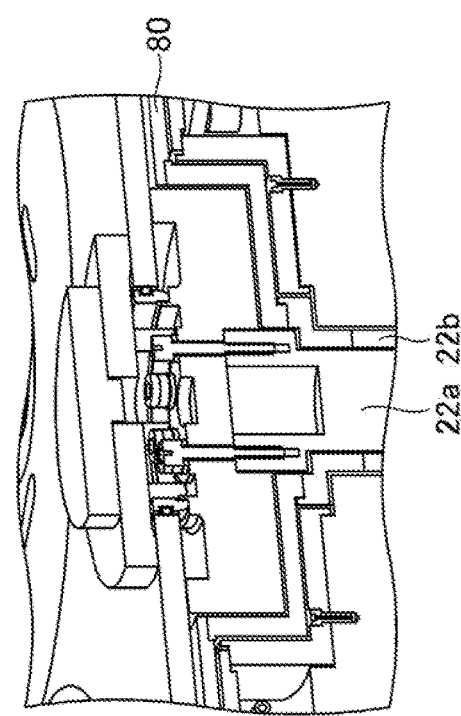

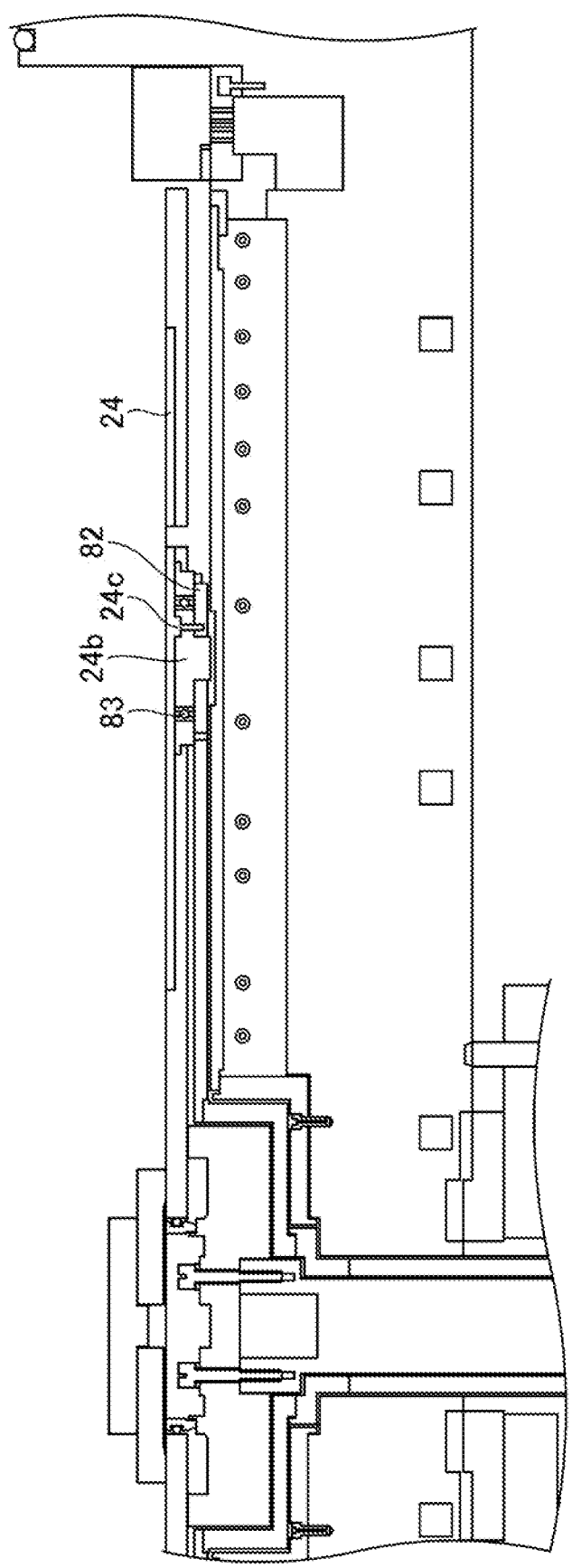

→ : ROLLING DIRECTION

⇒ : FORCE ACTING ON CONTACT SURFACE
➡ : ROTATION DIRECTION OF DRIVING PLATE
→ : ROLLING DIRECTION

→ : ROLLING DIRECTION

⇒ : FORCE ACTING ON CONTACT SURFACE
➙ : ROTATION DIRECTION OF DRIVING PLATE
→ : ROLLING DIRECTION

ROTATION DRIVING MECHANISM AND ROTATION DRIVING METHOD, AND SUBSTRATE PROCESSING APPARATUS AND SUBSTRATE PROCESSING METHOD USING SAME

CROSS-REFERENCE TO RELATED APPLICATION

The present application is based on and claims priority to Japanese Patent Application No. 2019-215580 filed on Nov. 28, 2019, the entire contents of which are hereby incorporated herein by reference.

BACKGROUND OF THE INVENTION

1. Field of the Invention

The present disclosure relates to a rotation driving mechanism and a rotation driving method, and a substrate processing apparatus and a substrate processing method using the same.

2. Description of the Related Art

Conventionally, as disclosed in Japanese Laid-Open Patent Application Publication No. 2016-96220, a film deposition apparatus has been known in which a substrate is placed on a substrate receiving region of a turntable in a vacuum chamber; the turntable is rotated and the substrate receiving region is rotated; the substrate sequentially passes through a plurality of processing gas supply regions disposed along a rotational direction of the turntable; and different processing gases are sequentially supplied to the substrate, thereby performing ALD (Atomic Layer Deposition).

Such a film deposition apparatus includes a first gear that is rotatable along the rotational direction of the turntable and is disposed on the other side of the turntable for rotating the substrate receiving region, and a second gear that is formed of planetary gears that are engaged with the first gear and rotate the substrate receiving region so that the substrate rotates by rotating the first gear, and a rotation drive unit that rotates the first gear to adjust the rotational speed of the substrate. Such a configuration can reduce the number of rotation drive units provided to rotate the substrate.

SUMMARY OF THE INVENTION

Some embodiment of the present disclosure is intended to provide a rotation driving mechanism and a rotation driving method, and a substrate processing apparatus and a substrate processing method using the above capable of reducing particles.

In order to achieve the above-described object, there is provided a rotation driving mechanism that includes a turntable configured to rotate about a first axis, and a rotating plate disposed along a circumferential direction of the turntable and configured to rotate about a second axis independently of a rotation of the turntable. A driving plate is coaxially disposed with the first axis of the turntable and is rotatable differently in rotational direction and rotational speed from the rotation of the turntable. A trajectory plate is fixed to the driving plate and disposed in the vicinity of the second axis of the rotating plate. The trajectory plate includes a rolling trajectory groove in a surface. The trajectory groove has a curved shape in a plan view. A horizontal rotating member is coupled to and fixed to the rotating plate and engaged with the rolling trajectory groove. The horizontal rotating member is configured to rotate the rotating plate by moving and rolling through the rolling trajectory groove.

Additional objects and advantages of the embodiments are set forth in part in the description which follows, and in part will become obvious from the description, or may be learned by practice of the disclosure. The objects and advantages of the disclosure will be realized and attained by means of the elements and combinations particularly pointed out in the appended claims. It is to be understood that both the foregoing general description and the following detailed description are exemplary and explanatory and are not restrictive of the disclosure as claimed.

BRIEF DESCRIPTION OF THE DRAWINGS

FIGS. 3A and 3B are cross-sectional views taken along a circumferential direction of a separation region of a film deposition apparatus according to the present embodiment;

FIGS. 4A and 4B are diagrams illustrating an example of a configuration of a turntable and a rotating plate of a rotating mechanism according to the present embodiment;

FIGS. 6A and 6B are views illustrating a cross-sectional structure of an entire turntable and a central axis of a rotating mechanism according to the present embodiment;

FIG. 7 is a diagram illustrating an example of a coupling structure of a rotating mechanism according to the present embodiment;

DETAILED DESCRIPTION OF THE PREFERRED EMBODIMENTS

Hereinafter, embodiments for carrying out the present disclosure will be described with reference to the drawings.

Figure 1:
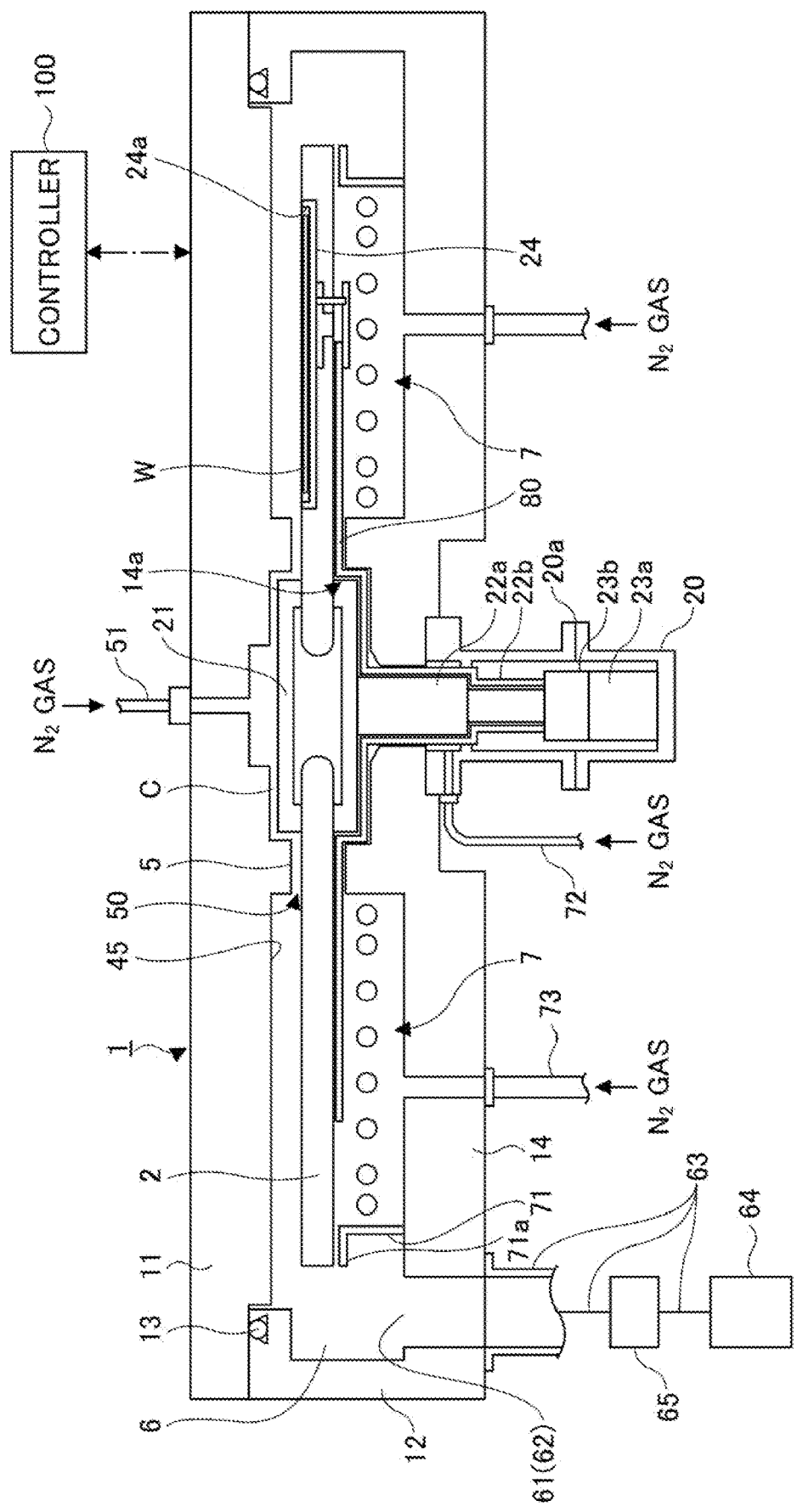
FIG. 1 is a cross-sectional view of a film deposition apparatus according to an embodiment of the present disclosure.

FIG. 1 is a cross-sectional view of a film deposition apparatus according to an embodiment of the present disclosure. As illustrated, the film deposition apparatus includes a vacuum chamber 1 having a flat cylindrical shape and a turntable 2 disposed within the vacuum chamber 1. The vacuum chamber 1 includes a chamber body 12 and a ceiling plate 11 removable from the chamber body 12. The ceiling plate 11 is disposed on the chamber body 12 via a seal member 13, such as an O-ring, to be able to evacuate the vacuum chamber 1. The ceiling plate 11 is lifted by a drive mechanism (not illustrated) when being removed from the vacuum chamber 1.

The bottom portion 14 of the chamber body 12 includes a raised portion 14a that is raised in two stages in an annular shape near the center and a cover member 71 having a flat cylindrical shape. The space surrounded by the raised portion 14a, the cover member 71, and the turntable 2 disposed at predetermined intervals above the raised portion 14a is used as a heater housing portion and the heater unit 7 is housed therein.

The turntable 2 is made of quartz in this embodiment and is formed into a disc shape. The turntable 2 has a circular opening in the center and is held between the top and bottom by a cylindrical core portion 21 around the opening. The core portion 21 is secured to the upper end of a vertically extending first rotating shaft 22. The first rotating shaft 22 passes through the bottom surface portion 14 of the chamber body 12, and a lower end thereof is mounted to the first driving portion 23a that in this example rotates the first rotating shaft 22a about the vertical axis in a clockwise direction. With this configuration, the turntable 2 can rotate about the center that is an axis.

Further, a second rotating shaft 22b is disposed to surround the first rotating shaft 22a. The second rotating shaft 22b is a rotating shaft for rotating the driving plate 80. The second rotating shaft 22b is disposed coaxially with the first rotating shaft 22a. However, the second rotating shaft 22b can rotate the driving plate 80 that is a different rotating object from that of the first rotating shaft 22a at a different rotating speed in a different rotational direction from those of the first rotating shaft 22a. That is, although the second rotating shaft 22b is co-axial with the first rotating shaft 22a, the second rotating shaft 22a can rotate independently of the first rotating shaft 22a. The driving plate 80 is a rotation transmission member for rotating the rotating plate 24 that is a substrate receiving region, and is rotated by the second rotating shaft 22b.

The first and second rotating shafts 22a and 22b and the first and second driving portions 23a and 23b are housed in a cylindrical case body 20 having an opening at the top surface. The case body 20 is hermetically attached to the underside of the bottom portion 14 of the vacuum chamber 1 via a flange portion 20a on the upper surface thereof, thereby isolating the internal atmosphere of the case body 20 from the external atmosphere.

Figure 2:
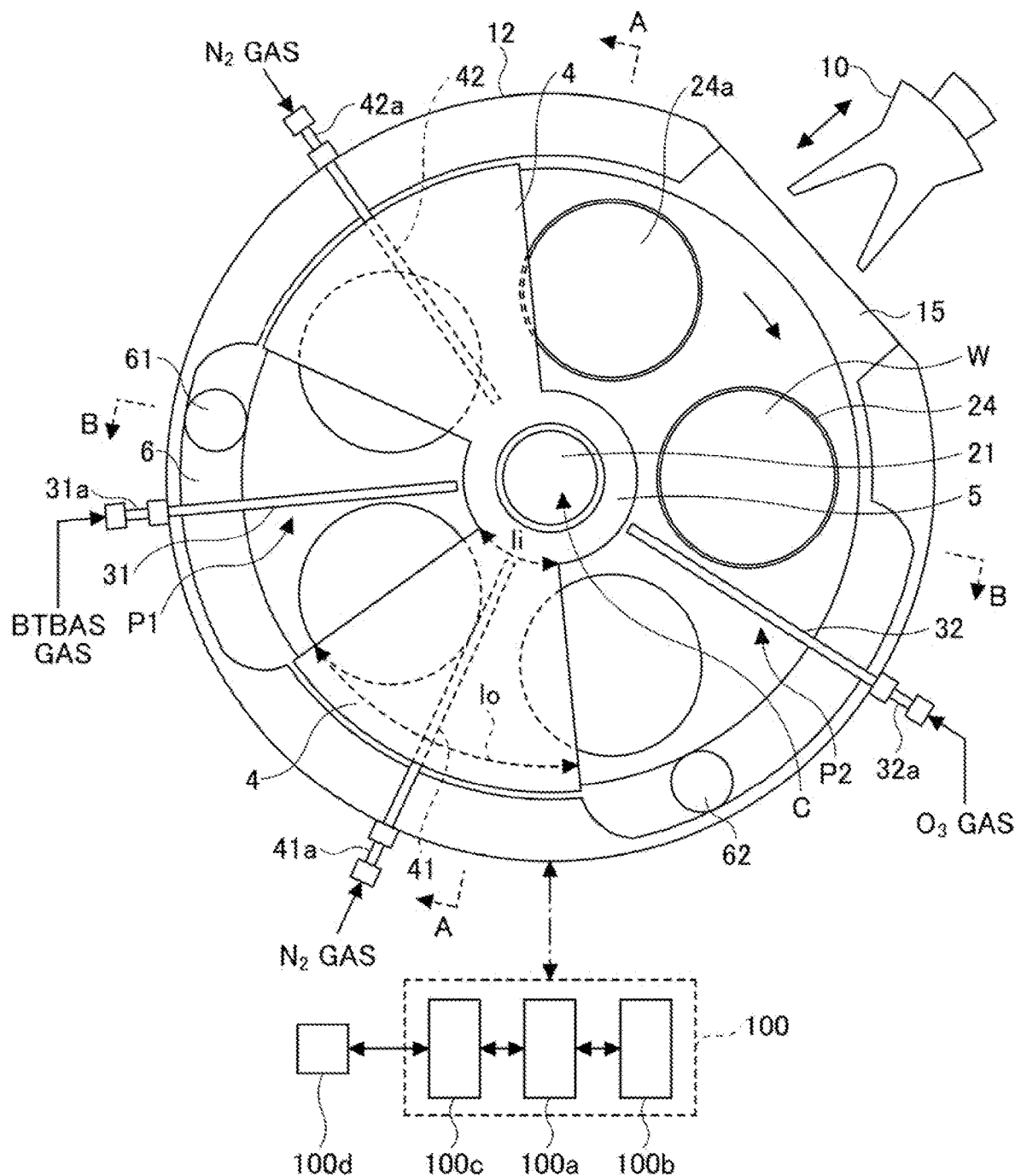
FIG. 2 is a plan view of a turntable and a chamber body of the deposition apparatus according to the present embodiment.

FIG. 2 is a plan view illustrating a turntable and a chamber body of the film deposition apparatus according to the present embodiment. Referring to FIG. 2, a plurality of (five, illustrated in the example) rotating plates 24 is disposed on the upper surface of the turntable 2. A circular recess 24a for holding a wafer W is formed on the upper surface of the rotating plate 24. That is, the circular recess 24a functions as a substrate receiving region. Only a single wafer W is illustrated in FIG. 2. The rotating plate 24 is equally spaced in the turntable 2.

FIGS. 3A and 3B are cross-sectional views taken along a circumferential direction of the separation region of the film deposition apparatus according to the present embodiment. FIG. 3A is a projected cross-sectional view along an arc extending from the first reaction gas nozzle 31 to the second reaction gas nozzle 32 illustrated in FIG. 2. As illustrated in FIG. 3A, the recess 24a has a diameter that is slightly larger than the diameter of the wafer W, for example, 4 mm larger and a depth that is equal to the thickness of the wafer W. Accordingly, when the wafer W is placed on the recess 24a, the surface of the wafer W is at the same height as the surface of the region other than the recess 24a of the turntable 2. If there is a relatively large step difference between the wafer W and its region, turbulence in the gas flow is generated due to the step difference, and the uniformity of the film thickness on the wafer W is affected. Thus, the two surfaces are at the same height. The "same height" means that the difference in height is about 5 mm or less, but the difference should be as close to zero as possible to the extent permitted by the machining accuracy. Three through holes (not illustrated) are formed at the bottom of the recess 24a through which the three up and down pins (not illustrated) move up and down. A lift pin supports the back of the wafer W and raises and lowers the wafer W.

The recess 24a is a housing region of the wafer W in which the wafer is positioned and the wafer W is prevented from being ejected by the centrifugal force generated by the rotation of the turntable 2. However, the housing region of the wafer W may not be limited to the recess 24a, but may be implemented by a guide member positioned at predetermined angular intervals on the turntable 2 to hold the ends of the wafer W.

Referring to FIG. 2, a first reaction gas nozzle 31, a second reaction gas nozzle 32, and separate gas nozzles 41 and 42 are disposed above the turntable 2, which extends radially at predetermined angular intervals. This arrangement allows the recess 24a to pass under the nozzles 31, 32, 41 and 42. In the illustrated example, a second reaction gas nozzle 32, a separating gas nozzle 41, a first reaction gas nozzle 31, and a separating gas nozzle 42 are arranged clockwise in this order. These gas nozzles 31, 32, 41 and 42 penetrate the circumferential wall of the chamber body 12 and are supported by attaching the end portions, which are gas introduction ports 31a, 32a, 41a and 42a, to the circumferential wall. The gas nozzles 31, 32, 41, and 42 are introduced into the chamber 1 from the circumferential wall of the chamber 1 in the illustrated example, but may be introduced from a protruding part 5 (described below). In this case, an L-shaped conduit may be disposed that opens to the outer peripheral surface of the protruding part 5 and the outer surface of the top plate 11, gas nozzles 31 (32, 41, 42) may be connected to one opening of the L-shaped conduit in the chamber 1, and gas introduction ports 31a (32a, 41a, 42a) may be connected to the other opening of the L-shaped conduit outside the chamber 1.

Although not illustrated, the reaction gas nozzle 31 is connected to a gas source of the first reaction gas, bistal-butylamonosilane (BTBAS), via the gas introduction port 31a, and the reaction gas nozzle 32 is connected to a gas source of the second reaction gas that is ozone ($O_3$), via the gas introduction port 32.

The reaction gas nozzles 31 and 32 have discharge holes 33 for discharging the reaction gas downwardly spaced in the length direction of the nozzle. In this embodiment, the discharge holes 33 have an aperture of about 0.5 mm and are arranged about 10 mm apart along the length of the reaction gas nozzles 31 and 32. The reaction gas nozzles 31 and 32 are a first reaction gas supply part and a second reaction gas supply part, respectively. The lower region of the reaction gas nozzle 31 is also the first processing region P1 for adsorbing BTBAS gas to the wafer, and the lower region of the reaction gas nozzle 32 is the second processing region P2 for adsorbing $O_3$ gas to the wafer.

On the other hand, the separation gas nozzles 41 and 42 are connected to a gas source (not illustrated) of nitrogen gas ($N_2$). The separation gas nozzles 41 and 42 include discharge holes 40 for discharging the separation gas at the lower side. The discharge holes 40 are arranged at predetermined intervals in the longitudinal direction. In this embodiment, the discharge holes 40 have an aperture of about 0.5 mm and are arranged about 10 mm apart along the length of the separation gas nozzles 41 and 42.

The separation gas nozzles 41 and 42 are disposed in the separation region D configured to separate the first and second processing regions P1 and P2. In each separation region D, a convex portion 4 is disposed on the top plate 11 of the vacuum chamber 1, as illustrated in FIGS. 2, 3A and 3B. The convex portion 4 has a fan-shaped top shape, the top of which is located at the center of the chamber 1, and the arc of which is located along the vicinity of the inner peripheral wall of the chamber body 12. The convex portion 4 also includes a groove 43 extending radially so that the convex portion 4 is bisected. The separation gas nozzle 41 (42) is housed in the groove 43. The distance between the central axis of the separation gas nozzle 41 (42) and one side of the fan-shaped convex portion 4 is approximately equal to the distance between the central axis of the separation gas nozzle 41 (42) and the other side of the fan-shaped convex portion 4. In this embodiment, the groove 43 is formed so as to equally divide the convex portion 4. However, in another embodiment, for example, the groove 43 may be formed so as to widen the upstream side of the turntable 2 in the rotation direction in the convex portion 4.

According to the above configuration, as illustrated in FIG. 3A, the separation gas nozzle 41 (42) has a flat, low ceiling surface 44 (first ceiling surface) on both sides and a high ceiling surface 45 (second ceiling surface) on both sides of the low ceiling surface 44. The convex portion 4 (the ceiling surface 44) forms a narrow space to prevent the first and second reaction gases from entering between the convex portion 4 and the turntable 2 and from mixing.

Referring to FIG. 3B, $O_3$ gas flowing from the reaction gas nozzle 32 toward the convex portion 4 along the direction of rotation of the turntable 2 is prevented from entering the space, and BTBAS gas flowing from the reaction gas nozzle 31 toward the convex portion 4 along the direction of rotation of the turntable 2 is prevented from entering the space. "Preventing the gas from entering" means that $N_2$ gas, which is the separation gas discharged from the separation gas nozzle 41, diffuses between the first ceiling surface 44 and the surface of the turntable 2 and blows into the space below the second ceiling surface 45 adjacent to the first ceiling surface 44 in this example, thereby preventing the gas from entering the lower ceiling space of the second ceiling surface 45. The term "the gas is unable to enter" does not mean that the gas cannot enter at all from the lower side space of the second ceiling surface 45 into the lower side space of the convex portion 4, but means that even if a part of the reaction gas enters, the reaction gas cannot further go toward the separation gas nozzle 41 and thus cannot be mixed together. That is, as long as such action is obtained, the separation region D separates the first processing region P1 from the second processing region P2. In addition, the gas adsorbed on the wafer can naturally pass through the separation region D. Therefore, prevention of a gas entry means a gas in the vapor phase.

Referring to FIGS. 1 and 2, the lower surface of the top plate 11 includes an annular protruding part 5 disposed such that the inner periphery faces the outer periphery of the core portion 21. The protruding part 5 faces the turntable 2 in an area outside the core portion 21. Further, the protruding part 5 is integrally formed with the convex part 4 and forms a plane between the lower surface of the convex portion 4 and the lower surface of the protruding part 5. That is, the height from the turntable 2 on the lower surface of the protruding part 5 is equal to the height of the lower surface (the ceiling surface 44) of the convex portion 4. This height is hereafter denoted by height h. The protruding part 5 and the convex portions 4 may not necessarily be integral and may be separate. FIG. 2 illustrates the internal configuration of the chamber 1 in which the top plate 11 is removed while the convex portion 4 remains in the chamber 1.

In this embodiment, the separation region D is formed by forming a groove 43 in the fan-shaped plate to be a convex portion 4 and placing the separation gas nozzle 41 (42) in the groove 43. However, the two fan plates may be screwed onto the lower surface of the top plate 11 so that the two fan plates are positioned on both sides of the separation gas nozzle 41 (42).

The lower surface of the convex portion 4, that is, the height h measured from the surface of the ceiling surface 44, of the turntable 2 (FIG. 3A) may be, for example, about 0.5 mm to about 10 mm, and is preferably about 4 mm. The rotational speed of the turntable 2 is set to, for example, 1 rpm to 500 rpm. In order to secure the separation function of the separation region D, the size of the convex portion 4 and the height h between the lower surface of the convex portion 4 (the first ceiling surface 44) and the surface of the turntable 2 may be set through experiments, for example, depending on the pressure in the processing chamber 1 and the rotational speed of the turntable 2. As the separation gas, in this embodiment, $N_2$ gas is used, but as long as the separation gas does not affect the formation of the silicon oxide film, an inert gas such as He or Ar gas or hydrogen gas may be used.

Referring to FIG. 1 again, the chamber body 12 has a depression in an inner peripheral portion of the chamber body 12 facing an outer peripheral surface of the turntable 2. Hereafter, this indentation is referred to as an exhaust region 6. Below the exhaust region 6 is an exhaust port 61 (see FIG. 2 for other exhaust ports 62), to which a vacuum pump 64 is connected via an exhaust line 63, which may also be used for other exhaust ports 62. The exhaust pipe 63 is disposed with a pressure regulator 65. A plurality of pressure regulators 65 may be disposed to the corresponding exhaust ports 61, 62.

Referring to FIG. 2 again, the exhaust port 61 is disposed between the first reaction gas nozzle 31 and the convex portion 4, which is positioned downstream in the clockwise rotation direction of the turntable 2 with respect to the first reaction gas nozzle 31 viewed from above. With this arrangement, the exhaust port 61 is substantially capable of evacuating the BTBAS gas from the first reaction gas nozzle 31. Meanwhile, the exhaust port 62 is disposed between the second reaction gas nozzle 32 and the convex section 4 that is positioned downstream of the turntable 2 in the clockwise rotation direction with respect to the second reaction gas nozzle 32 viewed from above. With this arrangement, the exhaust port 62 is substantially capable of exhausting $O_3$ gas exclusively from the second reaction gas nozzle 32. Accordingly, the exhaust ports 61, 62 configured in this manner can assist in the separation region D preventing the mixture of BTBAS and $O_3$ gases.

As illustrated in FIG. 1, the space between the turntable 2 and the bottom portion 14 of the chamber body 12 includes an annular heater unit 7 as a heating unit, thereby heating the wafer W on the turntable 2 through the turntable 2 to a temperature determined by a process recipe. The cover member 71 surrounds the heater unit 7 near the outer circumference of the turntable 2 below the turntable 2, and the space where the heater unit 7 is placed is partitioned from the area outside the heater unit 7. The cover member 71 has a flange portion 71a at an upper end, and the flange portion 71a is disposed so as to maintain a slight gap between the lower surface of the turntable 2 and the flange portion in order to prevent a gas from flowing into the cover member 71.

Referring to FIG. 1 again, the bottom portion 14 has a raised portion 14a inside the annular heater unit 7. The upper surface of the raised portion 14a is in close proximity to the turntable 2 and the raised portion 14a and to the core portion 21, leaving a slight gap between the upper surface of the raised portion and the turntable 2 and between the upper surface of the raised portion 14a and the back surface of the core portion 21. The bottom portion 14 also has a central hole through which the rotating shaft 22 passes. The inner diameter of the central hole is slightly larger than the diameter of the rotating shaft 22, leaving a clearance communicating with the case 20 through the flange portion 20a. A purge gas supply line 72 is connected to the top of the flange portion 20a. A plurality of purge gas supply lines 73 are connected to the region below the heater unit 7 at predetermined angular intervals to purge the region where the heater unit 7 is housed.

This arrangement allows $N_2$ purge gas to flow from the purge gas supply line 72 into the heater space through a gap between the central aperture of the rotating shaft 22 and the bottom portion 14, a gap between the core 21 and the raised portion 14a of the bottom portion 14, and a gap between the raised portion 14a of the bottom portion 14 and the back surface of the turntable 2. $N_2$ gas flows from the purge gas supply line 73 to the space under the heater unit 7. $N_2$ purge gas flows into the exhaust port 61 through a gap between the flange portion 71a of the cover member 71 and the back surface of the turntable 2. $N_2$ purge gas acts as a separation gas that prevents the first (second) reaction gas from flowing through the space below the turntable 2 and mixing with the second (first) reaction gas.

A separation gas supply line 51 is connected to the center of the top plate 11 of the chamber 1 to supply $N_2$ gas, which is the separation gas, to the space between the top plate 11 and the core portion 21. The separation gas supplied to a space 52 flows along the surface of the turntable 2 through a narrow clearance 50 between the protruding part 5 and the turntable 2 and reaches the exhaust region 6. Because a space 53 and the clearance 50 are filled with the separation gas, the reaction gas (BTBAS, $O_3$) does not go through the center of the turntable 2. That is, the film deposition apparatus according to the present embodiment includes the center region C, which is defined by the rotation center portion of the turntable 2 and the chamber 1 in order to separate the first processing region P1 and the second processing region P2, and is configured with a discharge port that discharges the separation gas toward the upper surface of the turntable 2. In the example illustrated in the drawings, the discharge port corresponds to the narrow clearance 50 between the protruding part 5 and the turntable 2.

A purge gas supply line 72 is connected to the flange portion 20a through which a purge gas ($N_2$ gas) is supplied to the inside of the flange portion 20a and the case body 20. The purge gas flows through the gap between the rotating shaft 22 and the raised portion 14a of the bottom portion 14, the gap between the core portion 21 and the raised portion 14a, and the gap between the raised portion 14a and the turntable 2 to the heater housing portion in which the heater unit 7 is housed. Meanwhile, a plurality of purge gas supply lines 73 penetrating the bottom portion 14 of the chamber body 12 are connected at predetermined angular intervals to the heater housing through which a purge gas (such as $N_2$ gas) is supplied from a predetermined gas supply source (not illustrated). The purge gas is supplied from the purge gas supply tube 72 connected to the flange portion 20a and reaches the heater housing portion ($N_2$ gas or the like), and the purge gas is discharged from the gap between the cover member 71 and the turntable 2 to the exhaust region 6, and is discharged from the exhaust port 61 (62) to the exhaust device 64. At the upper end of the cover member 71, a flange portion 71a extending along the back surface of the turntable 2 in the outside direction of the cover member 71 is disposed. Accordingly, the flow of gas from the exhaust region 6 to the heater housing portion is prevented. Such a configuration prevents the first reaction gas from mixing with the second reaction gas through the space around the core portion 21 or the rotating shaft 22 or through the heater housing portion.

Further, as illustrated in FIG. 2, a transfer port 15 is formed on the side wall of the chamber body 12. A wafer W is conveyed into or out of the vacuum chamber 1 by external transfer arm 10 through the transfer port 15. The transfer port 15 includes a gate valve (not illustrated), which opens and closes the transfer port 15. When the recess 24a, which is the wafer receiving region of the turntable 2, is aligned with the transfer port 15 and the gate valve is opened, the wafer W is transported into the vacuum chamber 1 by the transfer arm 10 and placed in the recess 24a from the transfer arm 10. A lifting pin (not illustrated) is disposed for lowering the wafer W from the transfer arm 10 to the recess 24a and lifting the wafer from the recess 24a. The lifting pin is raised and lowered through a through hole formed in the recess 24a of the turntable 2 by a lifting mechanism (not illustrated).

The film deposition apparatus according to this embodiment includes a controller 100 for controlling the operation of the entire apparatus. The controller 100 includes a process controller 100a made of a computer, a user interface section 100b, and a memory device 100c. The user interface section 100b includes a display for displaying the operation status of the film deposition apparatus, a keyboard or a touch panel (not illustrated) for allowing an operator of the film deposition apparatus to select a process recipe, and for allowing a process administrator to change parameters of the process recipe.

The memory device 100c stores control programs, process recipes, and parameters in various processes that cause the process controller 100a to perform various processes. These programs also include a group of steps for performing the operations described below. These control programs and process recipes are read and executed by the process controller 100a according to instructions from the user interface unit 100b. These programs are stored in the computer-readable storage medium 100d and may be installed in the memory device 100c through an input/output device (not illustrated) corresponding thereto. The computer-readable storage medium 100d may be a hard disk, CD, CD-R/RW, DVD-R/RW, flexible disk, semiconductor memory, or the like. The program may also be downloaded to the memory device 100c via a communication line.

In a film deposition apparatus having such a configuration, a wafer W can be mounted on a concave portion 24a of a turntable 2, and a turntable 2 can be rotated while supplying processing gas from the reaction gas nozzles 31 and 32 and separating gas from the separating gas nozzles 41 and 42, thereby depositing a film on the wafer W. That is, the silicon oxide film may be deposited on the wafer W by an ALD process, for example, by supplying a silicon-containing gas from the reaction gas nozzle 31 and an oxidizing gas from the reaction gas nozzle 32.

Here, for example, when the rotational speed of the turntable 2 is set to ω, because the rotational speed v of the turntable 2 is v=rω (r is the distance from the center in the radial direction), it is conceivable that the movement speed differs between the position of the outer peripheral side inside the recess 24a and the position close to the rotation axis 22a inside the recess 24a, and that the film thickness may differ between the positions.

In order to reduce the speed difference in the positions of the turntable 2 in the radial direction in the recess 24a, in the deposition apparatus according to the present exemplary embodiment, the rotating plate 24 is rotated and the wafer W in the recess 24a is rotated while depositing the film.

Mechanisms for rotating the rolling plate 24 can be also damaged by thermal stresses, such as by the use of gears to produce particles, increase transfer friction, or the like. Therefore, in the deposition apparatus according to the present exemplary embodiment, a rotation mechanism using rolling contact is mounted.

FIGS. 4A and 4B are diagrams illustrating an example configuration of a turntable 2 and a rotating plate 24 of the rotating mechanism according to the present embodiment. FIG. 4A is a diagram illustrating the entire rotating plate 24, and FIG. 4B is a diagram illustrating an enlarged rotating axis 24b of the rotating plate 24.

As illustrated in FIG. 4A, the rotating plate 24 is disposed on the turntable 2 along a circumferential direction. The upper surface of the rotating plate 24 has a recess 24a and functions as a substrate receiving region as described above.

The rotating plate 24 may be constructed of a variety of materials depending on the application. For example, when a SiN film is deposited, a material having an expansion coefficient close to the SiN film may be used. For example, when a SiN film is formed by plasma CVD (Chemical Vapor Deposition), the thermal expansion coefficient is 2.8. In this case, for example, because the coefficient of thermal expansion of AlN is 4.6 and is relatively close to the coefficient of thermal expansion of a SiN film, the rotating plate 24 may be configured using AlN. Similarly, in the case of depositing the $SiO_2$ film, quartz, which is the same as a $SiO_2$ film in composition, may be used.

The rotating plate 24 has a rotating shaft 24b. The rotating shaft 24b is disposed so as to extend downwardly from the lower surface at the center of the rotating plate 24. A bearing 83 is disposed around the rotating shaft 24b. That is, the rotating shaft 24b has a vertical length so as to be received by the bearing 83. The bearing 83 is disposed to surround the periphery of the rotating shaft 24b in a horizontal direction to support rotation of the rotating shaft 24b in a horizontal direction (the rotating shaft is in the vertical direction).

A driving plate 80 extending from the second rotating shaft 22b is disposed below the rotating plate 24. The driving plate 80 is a plate for driving to rotate the rotating plate 24 and is a transmission medium for transmitting the rotation driving force of the second rotating shaft 22b to the rotating plate 24. The driving plate 80 has a disc-like shape, is coupled to and fixed to the second rotating shaft 22b, and rotates with the second rotating shaft 22b.

The driving plate 80 is preferably made of the same material as the turntable 2 in order to prevent deformation due to thermal expansion and rattling caused by the deformation. For example, the driving plate 80 is made of quartz.

As illustrated in FIGS. 4A and 4B, a trajectory plate 81 is part of a rotation driving mechanism disposed overlapping the rotating shaft 24b. As illustrated in FIG. 4B, the surface of the trajectory plate 81 includes a rolling trajectory groove 81a.

A horizontal rotating member 82 fixed to the rotating axis 24b of the rotating plate 24 fits into the rolling trajectory groove 81a of the trajectory plate 81. The horizontal rotating member 82 is a member capable of rolling and moving through the rolling trajectory groove 81a.

For example, the horizontal rotating member 82 may be comprised of a bearing. Smoothly horizontal rotation allows rolling and movement of the trajectory plate 81 along the rolling trajectory groove 81a.

The trajectory plate 81 is preferably made of alumina ($Al_2O_3$), for example, because it requires some strength and is preferably made of a material that is unlikely to produce particles.

The horizontal rotating member 82 may be, for example, a bearing made of $Si_3N_4$.

The rolling trajectory groove 81a of the trajectory plate 81 has an S shape in which a sine curve is lengthened. When the trajectory plate 81 is moved relative to the rotation of the turntable 2, the horizontal rotating member 82 rolls and moves inside the trajectory groove 81a. Because the rolling movement is the rotational movement of the horizontal rotating member 82, the rotating shaft 24b fixed to the horizontal rotating member 82 rotates.

Figure 5A:
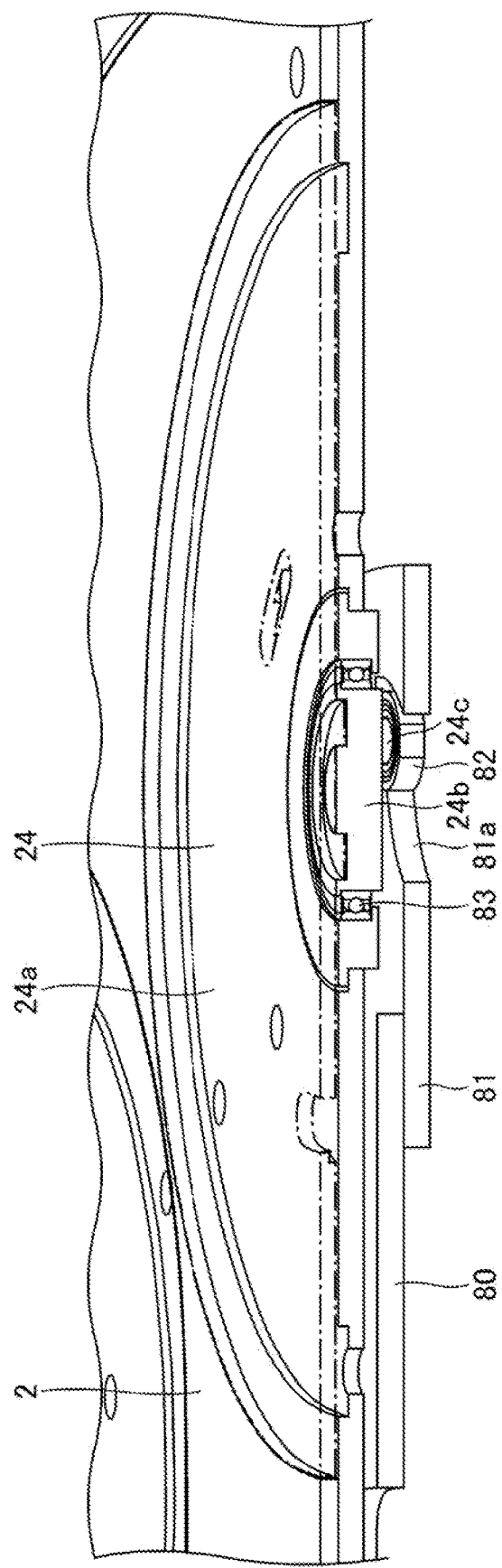
FIGS. 5A and 5B are cross-sectional views of a rotating mechanism according to the present embodiment.
Figure 5B:
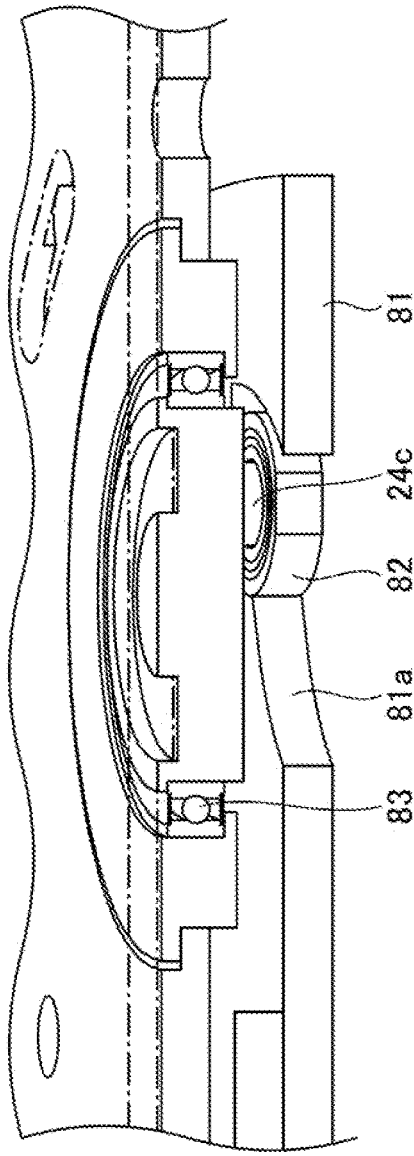

FIGS. 5A and 5B are cross-sectional views of the rotating plate 24 of the rotating mechanism according to the present embodiment. FIG. 5A is an enlarged cross-sectional view of the whole of the rotating plate 24, and FIG. 5B is an enlarged cross-sectional view near the rotating shaft 24b of the rotating plate 24.

As illustrated in FIG. 5A, the driving plate 80 extends from the center of the turntable 2 to the center of the rotating plate 24, and the trajectory plate 81 is fixed to the driving plate 80 so as to cover the lower part of the rotating axis 24b of the rotating plate 24. That is, the trajectory plate 81 makes the same movement as the driving plate 80.

Under the rotating plate 24, the rotating shaft 24b extends downward from the lower surface of the rotating plate 24, and a bearing 83 supports the circumference of the rotating shaft 24b.

A projecting shaft 24c extends further downward from the lower surface of the rotating shaft 24b, and a horizontal rotating member 82 configured as a bearing is disposed around the projecting shaft 24c to support the projecting shaft 24c. The horizontal rotating member 82 is disposed in the rolling trajectory groove 81a disposed on the trajectory plate 81 and rotates horizontally to roll and move within the rolling trajectory groove 81. At this time, the projecting shaft 24c extending from the rotating shaft 24b rotates; the rotating shaft 81b rotates; and the rotating plate 24 rotates.

Such a rolling movement reduces the frictional force and significantly reduces the generation of particles and transfer frictional forces as compared to a rotary drive using a gear.

The trajectory plate 81 may be detachably configured to test the optimum groove shape of the rolling trajectory groove 81a depending on the rotational speed and the process.

Further, the rotating plate 24 may be a material that absorbs radiant heat from the heater 7 and may be configured to reduce a decrease in film thickness due to a temperature gradient of the wafer edge.

FIGS. 6A and 6B are diagrams illustrating a cross-sectional structure of an entire turntable and a central axis. FIG. 6A is an enlarged view illustrating the vicinity of the central axis of the turntable.

As illustrated in FIG. 6A, the second rotating shaft 22b is disposed to cover the periphery of the first rotating shaft 22a.

The first rotating shaft 22a and the second rotating shaft 22b are coaxially and independently configured to control the rotation.

The first rotating shaft 22a forms the central axis of the turntable 2, while the second rotating shaft 22b forms the central axis of the driving plate 80. In rotation, the drive plate 80 is rotated, and the rotation of the driving plate 80 is converted to the movement of the rolling trajectory groove 81a of the trajectory plate 81, and the rotation of the projecting shaft 24c engaging with the rolling trajectory groove 81a is converted to rotate the rotating shaft 24b.

As illustrated in FIG. 6B, the second rotating shaft 22b is connected and fixed to the driving plate 80 extending in the outer circumferential direction and is configured to rotate the driving plate 80.

FIG. 7 is a diagram illustrating an exemplary coupling structure of the rotating plate 24. As illustrated in FIG. 7, the projecting shaft 24c projects downwardly from the lower surface of the rotating plate 24. As such, the projecting shaft 24c extends downwardly from the lower surface of the rotating plate 24 rather than the lower surface of the rotating shaft 24b. Even in this case, because the projecting shaft 24c is near the rotating shaft 24b, the rotating shaft 24b can be rotated.

Note herein that the rotation is not a single rotation, but a rotation such as a single oscillation that rolls clockwise and counterclockwise and repeats periodically in the rolling trajectory groove 81a. Because the rolling trajectory groove 81a is an S shape having an extended sine curve, the driving plate 80 performs an action of rolling and moving the horizontal rotating member 82 along the shape.

Details of the operation will be described below.

Figure 8A:
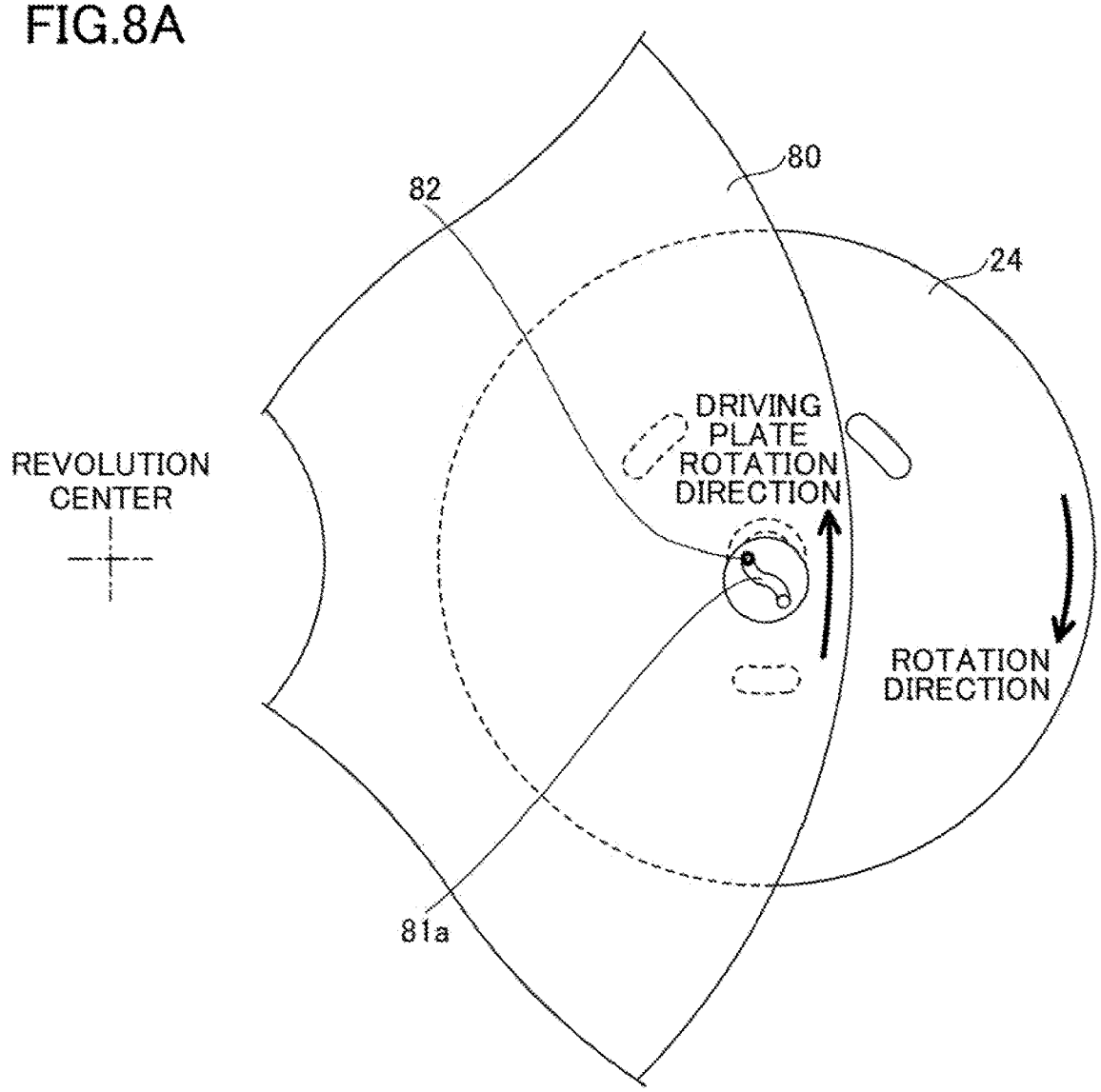
FIGS. 8A and 8B are views for explaining an example of a driving method of a rotating mechanism according to the present embodiment.
Figure 8B:
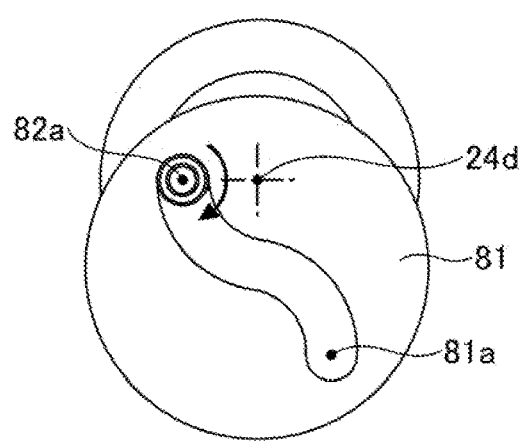

FIGS. 8A and 8B are diagrams for explaining an example of a driving method of a rotating mechanism. FIG. 8A is a diagram for explaining an operation of the entire rotating plate, and FIG. 8B is a diagram for explaining an operation near a rotating shaft.

As illustrated in FIG. 8A, when the driving plate 80 is moved forward, the horizontal rotating member 82 is reversed in the rolling trajectory groove 81a. Thus, the rotation direction is opposite to the driving plate 80.

Also, as illustrated in FIG. 8B, the trajectory plate 81 is disposed to cover the rotating center 24d. As the horizontal rotating member 82 rolls and moves along the trajectory groove 81a, the rotating shaft 24c rotates. The rotating plate 24 rotates as the horizontal rotating member 82 moves back and forth between the ends of the rolling trajectory groove 81a forming a sine curve. If the driving plate 80 is slightly slower than the turntable 2, the driving plate 80 moves backward, and if the driving plate 80 is slightly faster than the turntable 2, the driving plate 80 moves forward.

FIGS. 9A to 9H are diagrams illustrating an example of a driving method that allows the rotation direction to be reversed. In FIGS. 9A to 9H, a linear arrow indicates the force acting on the contact surface of the rolling trajectory groove 81a, a thick curved arrow indicates the direction of rotation of the driving plate 80, and a thin curved arrow indicates the direction of rolling of the horizontal rotating member 82.

Figure 9A:
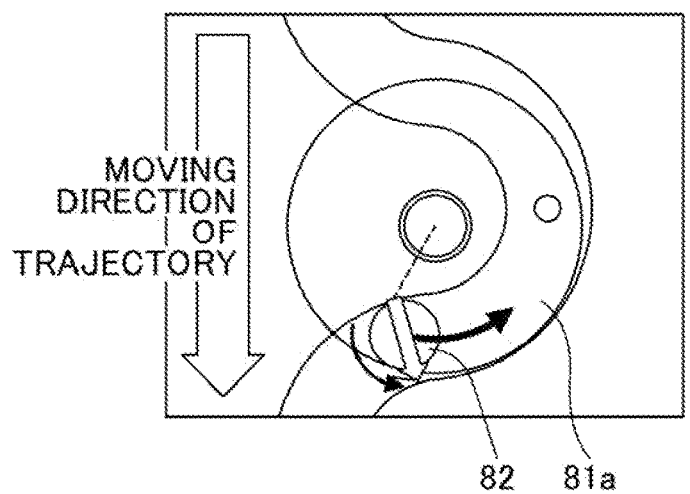
FIGS. 9A to 9H are diagrams illustrating an example of a driving method for allowing reverse rotation of a rotating mechanism according to the present embodiment.
Figure 9B:
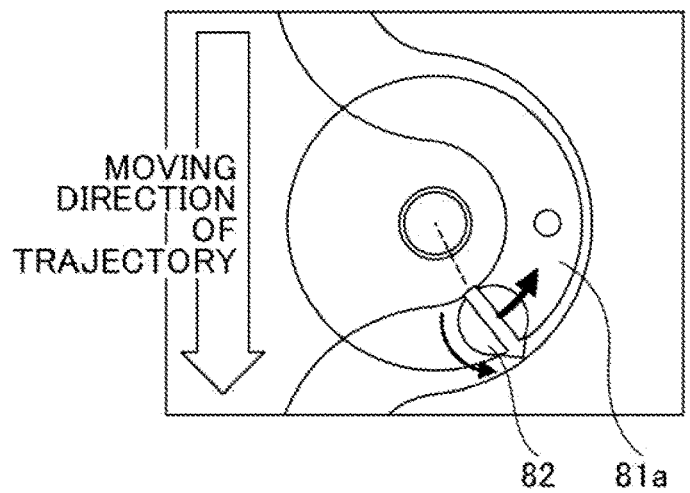

FIGS. 9A to 9B illustrate the movement of the driving plate 80 back and forth relative to the horizontal rotating member 82. At this time, the contact points between the horizontal rotating member 82 and the rolling trajectory groove 81a are on the upper side of both FIGS. 9a and 9b, and the rotation is the same as the rotation in a counterclockwise direction.

Figure 9C:
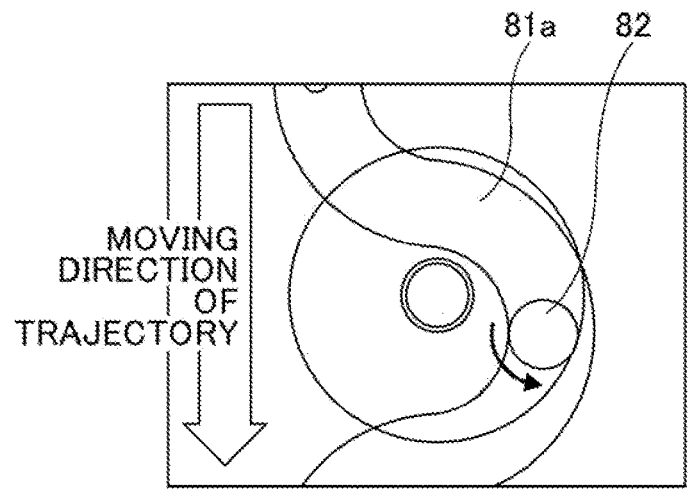
Figure 9D:
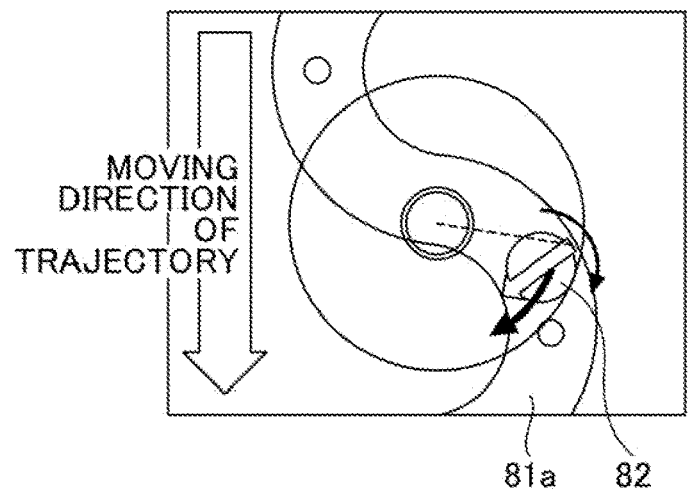

In FIG. 9C, the same movement is continued, but in FIG. 9D, because the left wall is lost, the horizontal rotating member 82 moves to the right wall. This inverts the direction of rotation. This is because there is a gap between the horizontal rotating member 82 and the rolling trajectory groove 81a, and the rolling trajectory groove 81a has a shape of a sine curve and the direction of contact is changed. Because the direction of rotation is in contact with the wall and the horizontal rotating member 82 is in the direction of rotation by receiving a force due to the movement of the wall, when the rolling trajectory groove 81c is retracted, the right side of the horizontal rotating member 82 is subject to a force that rotates clockwise. Therefore, the direction of rotation is reversed in a clockwise direction.

Figure 9E:
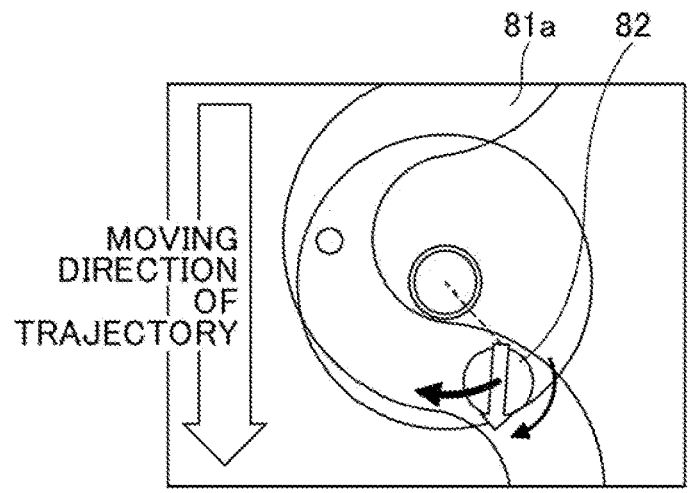
Figure 9F:
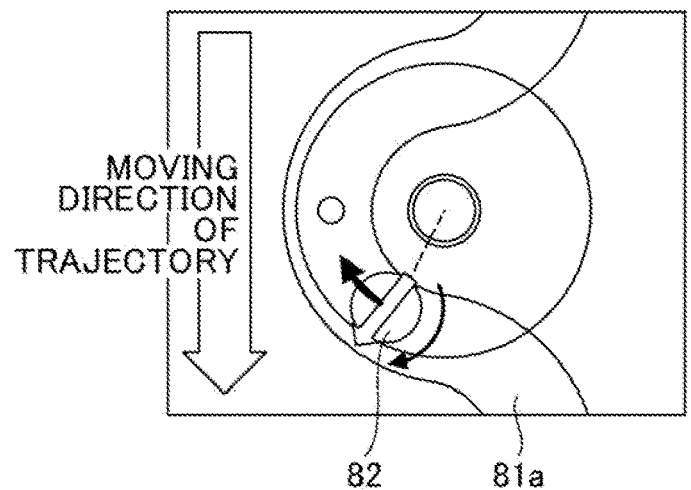
Figure 9G:
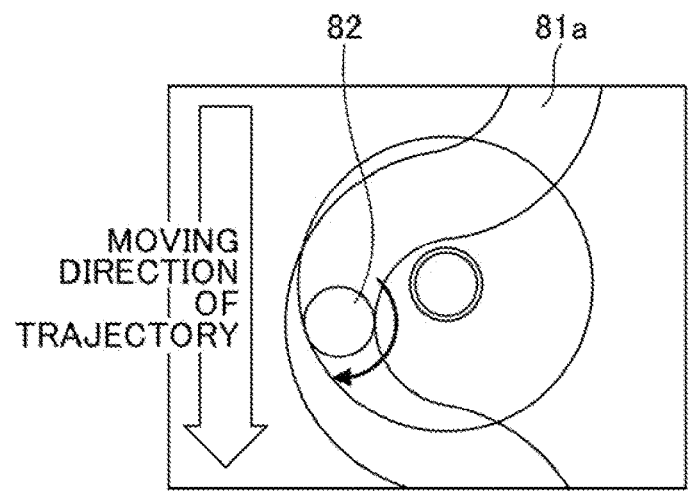

In FIG. 9E, the drive plate 80 remains clockwise. The horizontal rotating member 82 is in contact with the right wall. A similar state is maintained in FIG. 9F. A similar condition is maintained in FIG. 9G, where the right side wall disappears and is thrown out to the left.

Figure 9H:
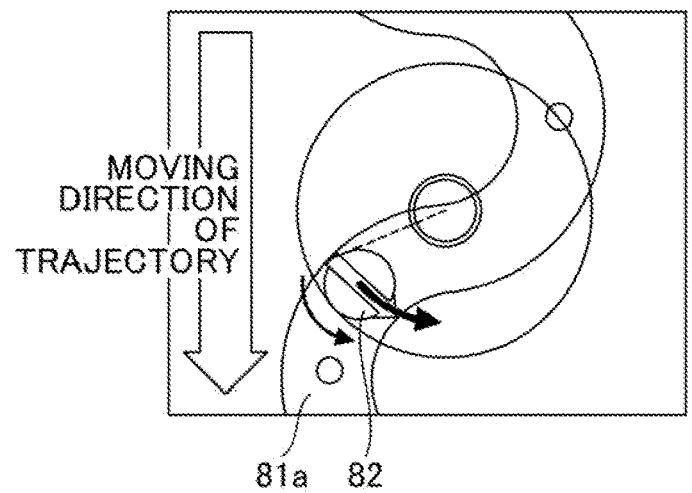

In FIG. 9H, the horizontal rotating member 82 contacts the left wall of the rolling trajectory groove 81a. This also inverts the direction of rotation and rotates the driving plate 80 counterclockwise.

Thus, when the driving plate 50 is simply moved by relative displacement and the horizontal rotating member 82 is moved without restriction, an inversion of the rotation occurs.

FIGS. 10A to 10H are diagrams illustrating an example of a driving method in which the horizontal rotating member 82 is not inverted.

Figure 10A:
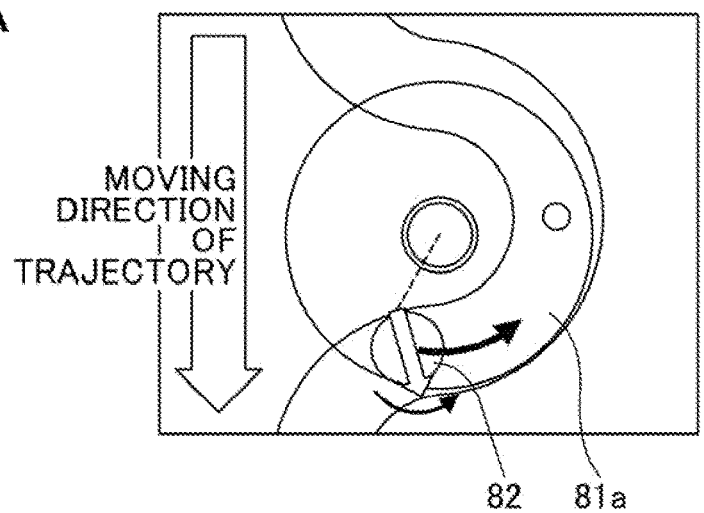
FIGS. 10A to 10H are diagrams illustrating an example of a driving method in which a horizontal rotating member of a rotating mechanism according to the present embodiment is not inverted.
Figure 10B:
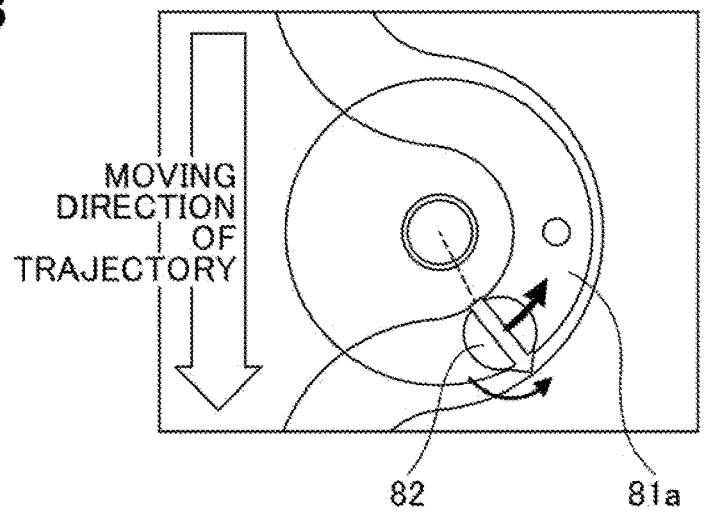
Figure 10C:
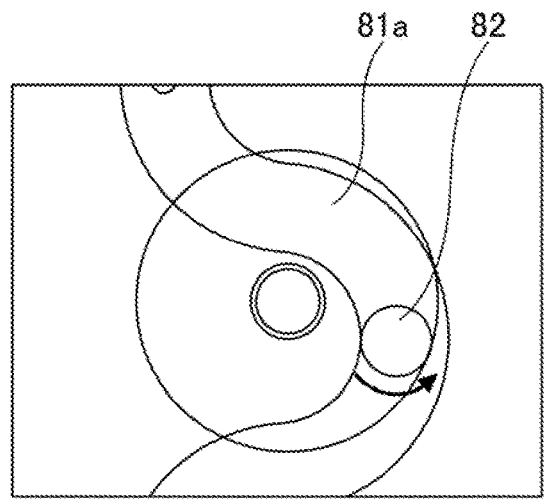

In FIGS. 10A to 10C, the horizontal rotating member 82 contacts the left side wall of the rolling trajectory groove 81a to maintain a counterclockwise rotational state.

Figure 10D:
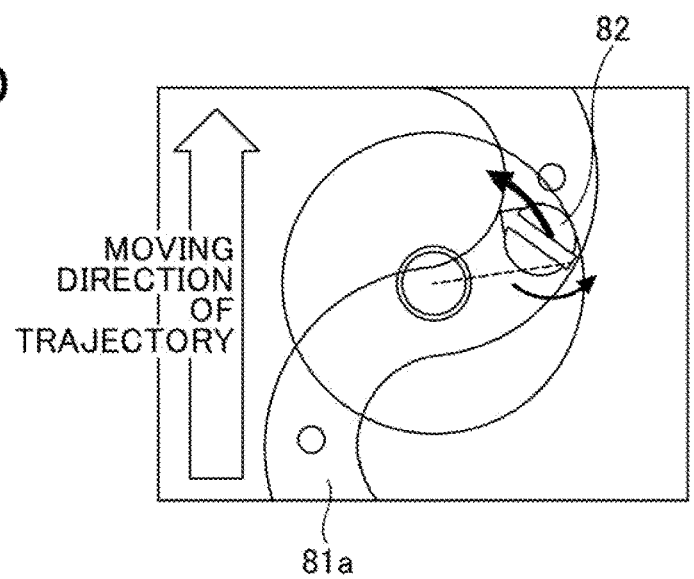

In FIG. 10D, when the drive plate 80 is retracted as is, an inversion occurs as described in FIGS. 9A to 9H. However, the driving plate 80 is inverted while the left wall of FIG. 10C is no longer constrained, and the driving plate 80 is relatively moved forward. Thus, the horizontal rotating member 82 contacts the right wall, but in turn the right wall advances and the horizontal rotating member 82 converts to a retracted rolling motion, and thus the rotating direction is maintained in a counterclockwise direction.

Figure 10E:
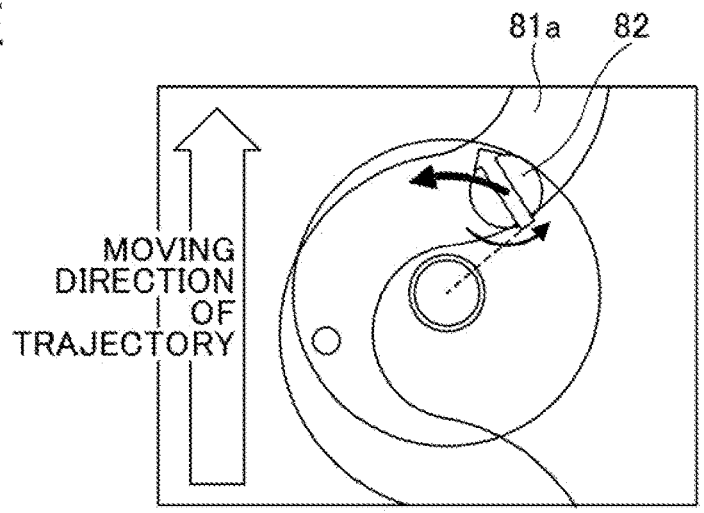
Figure 10F:
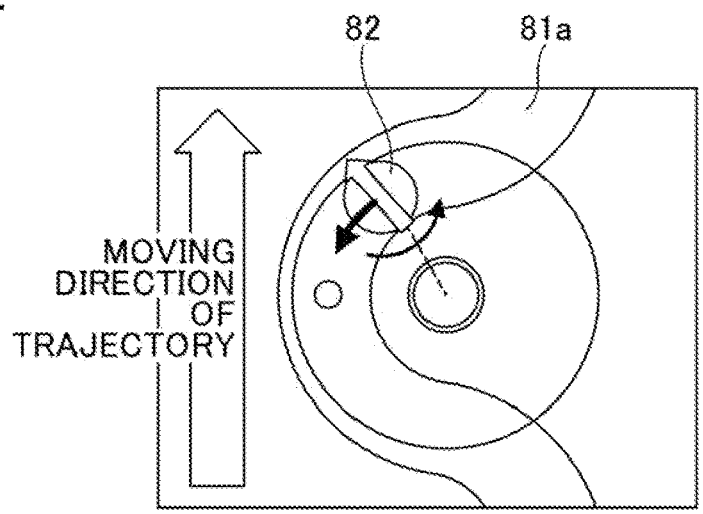
Figure 10G:
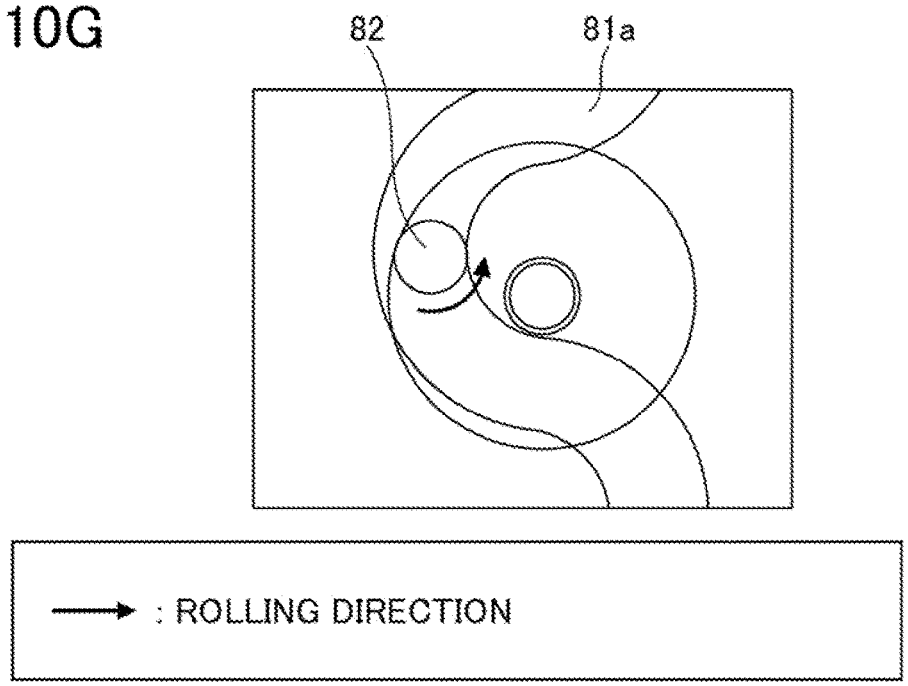

In FIGS. 10E to 10G, the state of FIG. 10D is maintained, and the horizontal rotating member 82 contacts the right wall and maintains a counterclockwise rotation.

Figure 10H:
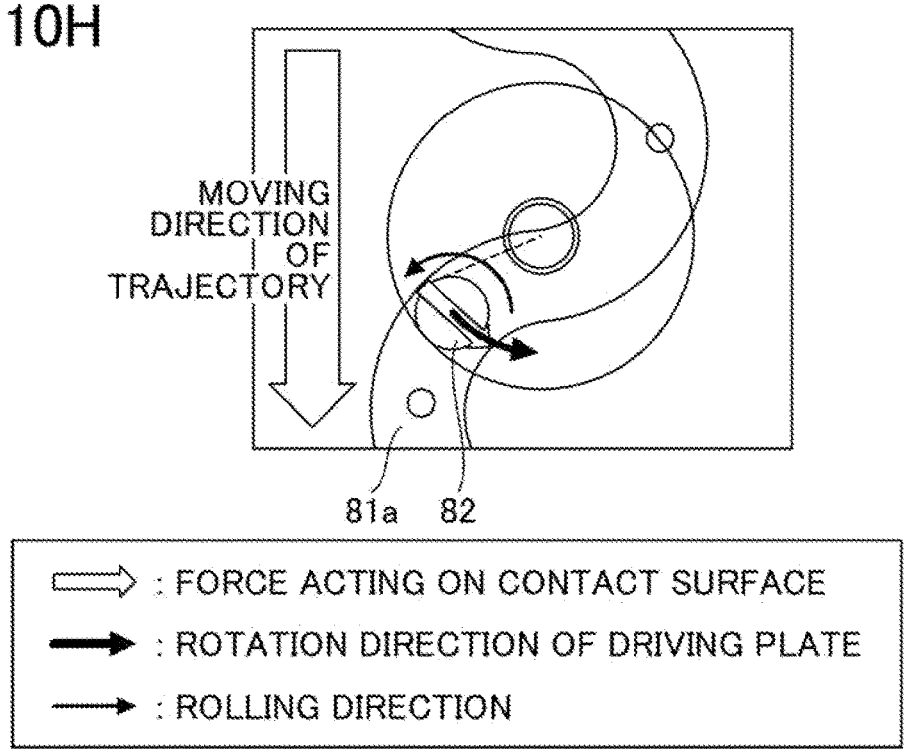

In FIG. 10G, the right-side wall is no longer constrained. Here again, as illustrated in FIG. 10H, the direction of movement of the driving plate 80 is reversed in the backward direction. Thus, the horizontal rotating member 82 contacts the left-side wall, but in turn the left-side wall retracts and the horizontal rotating member 82 moves forward, thereby maintaining the counterclockwise rotation.

As described above, when the rotation direction of the driving plate 80 is reversed at the timing when the right and left walls are no longer constrained, the horizontal rotating member 82 can maintain the rotation direction of the horizontal rotating member 82 because the rotation direction received from the wall is reversed even when the walls of the contacting rolling trajectory groove 81c are switched laterally.

Generally, when the rotation mechanism according to the present embodiment is applied to substrate processing such as film deposition, the direction of the rotation is preferably made unidirectional in order to accurately control the operating conditions and assure the uniformity of quality.

Therefore, when the substrate processing apparatus is configured by applying the rotating mechanism according to the present embodiment to substrate processing such as film deposition, a driving method in which the rotation method is made unidirectional may be used.

Such a driving method may be performed by the controller 100.

[Film Deposition Method]

Next, a film deposition method using a rotating mechanism and a film deposition apparatus according to the present embodiment will be described.

First, the turntable 2 is rotated so that the recesses 24 are aligned with the transfer port 15 to open the gate valve (not shown). Second, the transfer arm 10 conveys a wafer W into the chamber 1 through the transfer port 15. The wafer W is received by lift pins 16 and lowered to the recess 24 by lift pins 16 driven by lifting mechanism (not illustrated) after the transfer arm 10 is withdrawn from the chamber 1. The above-described sequence of operations is repeated five times, and five wafers W are mounted on the turntable 2. The vacuum pump 64 then evacuates the interior of the vacuum chamber 1 to a preset pressure. The turntable 2 starts to rotate clockwise as seen from above. At this time, the driving plate 80 starts to rotate, and the wafer W rotates.

Then, the power supply to the heater unit 7 is started, and the wafer W to be placed on the recess 24 of the turntable 2 is heated from the back surface of the turntable 2. After the confirmation that the temperature of the wafer W is stable at a predetermined set temperature, a first reaction gas (BTBAS) is supplied to the first processing region through the first reaction gas nozzle 31, and a second reaction gas ($O_3$) is supplied to the second processing region P2 through the second reaction gas nozzle 32. In addition, a separation gas ($N_2$) is supplied from the separation gas nozzles 41 and 42, and flows the space between the ceiling surface 44 and the top surface of the turntable 2 in both directions in the rotation direction of the turntable 2.

As the wafer W passes through the first processing region P1 below the first reaction gas nozzle 31, BTBAS molecules adsorb on the surface of the wafer W, and as the wafer W passes through the second processing region P2 below the second reaction gas nozzle 32, $O_3$ molecules adsorb on the surface of the wafer W, and $O_3$ oxidizes BTBAS molecules. Therefore, when the wafer W passes through both processing regions P1 and P2 once due to the rotation of the turntable 2, a single molecular layer of silicon oxide is formed on the surface of the wafer W. The wafer W then alternately passes through the processing regions P1 and P2 multiple times, and a silicon oxide film having a predetermined thickness is deposited on the surface of the wafer W. After a silicon oxide film having a predetermined thickness is deposited, the supply of BTBAS gas and ozone gas is stopped, and the rotation of the turntable 2 is stopped. Then, the wafer W is sequentially transported from the chamber 1 by the transfer arm 10 by the operation reverse to the transfer operation.

Because the turntable 2 rotates (revolves) while rotating the wafer W (mechanically, the rotating plate 24 and the recess 24a), the difference in speed between the inner and outer peripheral portions is eliminated, thereby allowing uniform film deposition.

According to the present disclosure, the embodiments provide a rotation driving mechanism and a rotation driving method that can inhibit the generation of particles and reduce the transmission friction, as well as a substrate processing apparatus and a substrate processing method using the same.

Although an example in which the rotation mechanism is applied to the film deposition apparatus and the film deposition method has been described in this embodiment, the embodiments are applicable to all of the substrate processing apparatus of the turntable type, and the embodiments are also applicable to an etching apparatus, other types of film deposition apparatus, other substrate processing apparatus, and a processing method using them.

The rotating mechanism and the method according to the present embodiment are not limited to substrate processing, but are also applicable to various types of apparatuses and methods that require rotation and revolution. In addition, the present disclosure is not limited to a configuration in which a target to be processed is mounted on a rotating plate. When an object is accommodated below the rotating plate, a rotating mechanism may be disposed on the upper side of the rotating plate.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A rotation driving mechanism, comprising:
   a turntable configured to rotate about a first axis;
   a rotating plate disposed along a circumferential direction of the turntable and configured to rotate about a second axis independently of a rotation of the turntable;
   a driving plate coaxially disposed with the first axis of the turntable and rotatable differently in rotational direction and rotational speed from the rotation of the turntable;
   a trajectory plate fixed to the driving plate and disposed in the vicinity of the second axis of the rotating plate, the trajectory plate including a rolling trajectory groove in a surface, the trajectory groove having a curved shape in a plan view; and
   a horizontal rotating member coupled to and fixed to the rotating plate and engaged with the rolling trajectory groove, the horizontal rotating member being configured to rotate the rotating plate by moving and rolling through the rolling trajectory groove,
   wherein the rolling trajectory groove has an S shape formed by lengthening a sine curve.

2. The rotation driving mechanism as claimed in claim 1, further comprising:
   a projecting axis projecting from the rotating plate,
   wherein the horizontal rotating member is fixed to the projecting axis, and
   wherein the horizontal rotating member forms a bearing configured to receive and support the projecting axis.

3. The rotation driving mechanism as claimed in claim 1, wherein the turntable is configured to rotate at a first rotational speed, and
   wherein the rotating plate is configured to be rotated by moving the horizontal rotating member back and forth along the rolling trajectory groove by rotating the driving plate alternatively at a second rotational speed faster than the first rotational speed and at a third speed slower than the first rotational speed.

4. The rotation driving mechanism as claimed in claim 1, wherein the rolling trajectory grove is disposed at a position that intersects a line connecting the first axis of the turntable and the second axis of the rotating plate.

5. A rotation driving mechanism, comprising:
a turntable configured to rotate about a first axis;
a rotating plate disposed along a circumferential direction of the turntable and configured to rotate about a second axis independently of a rotation of the turntable;
a driving plate coaxially disposed with the first axis of the turntable and rotatable differently in rotational direction and rotational speed from the rotation of the turntable;
a trajectory plate fixed to the driving plate and disposed in the vicinity of the second axis of the rotating plate, the trajectory plate including a rolling trajectory groove in a surface, the trajectory groove having a curved shape in a plan view; and
a horizontal rotating member coupled to and fixed to the rotating plate and engaged with the rolling trajectory groove, the horizontal rotating member being configured to rotate the rotating plate by moving and rolling through the rolling trajectory groove, wherein the driving plate and the trajectory plate are disposed below the rotating plate, and the horizontal rotating member is disposed on a lower surface of the rotating plate.

6. The rotation driving mechanism as claimed in claim 5, wherein at least one substrate receiving region receivable a substrate thereon is disposed over an upper surface of the rotating plate.

7. The rotation driving mechanism as claimed in claim 6, wherein the at least one substrate receiving region includes a plurality of substrate receiving regions disposed along the circumferential direction of the turntable.

8. A substrate processing apparatus, comprising:
the rotation driving mechanism as claimed in claim 7;
a chamber configured to house the turntable, the driving plate, the trajectory plate, and the horizontal rotating member; and
a reaction gas supply part configured to supply a reaction gas to the turntable.

9. The substrate processing apparatus as claimed in claim 8,
wherein the reaction gas supply part includes a plurality of reaction gas supply parts along the circumferential direction of the turntable, further comprising:
a purge gas supply part configured to supply a purge gas to a region between the plurality of reaction gas supply parts, and
wherein ALD is performed by supplying a reaction gas from the reaction gas supply part and a purge gas from a purge gas supply part while operating the rotation driving mechanism and rotating the turntable.

* * * * *